United States Patent
Son et al.

(10) Patent No.: US 12,283,307 B2
(45) Date of Patent: Apr. 22, 2025

(54) MEMORY CONTROL CIRCUIT PROVIDING DIE-LEVEL READ RETRY TABLE, MEMORY PACKAGE, AND STORAGE DEVICE

(71) Applicant: SK hynix Inc., Icheon-si (KR)

(72) Inventors: Jae Yong Son, Icheon-si (KR); Nam Kyeong Kim, Icheon-si (KR); Hoon Cho, Icheon-si (KR); Hyuk Min Kwon, Icheon-si (KR); Dae Sung Kim, Icheon-si (KR); Jang Seob Kim, Icheon-si (KR); Sang Ho Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 190 days.

(21) Appl. No.: 18/063,007

(22) Filed: Dec. 7, 2022

(65) Prior Publication Data
US 2024/0029787 A1 Jan. 25, 2024

(30) Foreign Application Priority Data
Jul. 25, 2022 (KR) .................. 10-2022-0091896

(51) Int. Cl.
*G11C 11/56* (2006.01)
*G11C 11/4078* (2006.01)
*G11C 11/408* (2006.01)
*G11C 11/4096* (2006.01)

(52) U.S. Cl.
CPC ...... *G11C 11/4096* (2013.01); *G11C 11/4078* (2013.01); *G11C 11/4085* (2013.01)

(58) Field of Classification Search
CPC .................. G11C 11/4096; G11C 11/4085
See application file for complete search history.

(56) References Cited

U.S. PATENT DOCUMENTS

| | | | |
|---|---|---|---|
| 2016/0179617 A1* | 6/2016 | Lee | G06F 11/1048 |
| | | | 714/755 |
| 2018/0046527 A1* | 2/2018 | Reusswig | G06F 11/004 |
| 2019/0043566 A1* | 2/2019 | Wu | G11C 7/04 |
| 2020/0065174 A1* | 2/2020 | Zeng | G11C 16/3404 |
| 2021/0026718 A1* | 1/2021 | Huang | G06F 11/076 |

FOREIGN PATENT DOCUMENTS

| | | |
|---|---|---|
| KR | 10-2014-0071779 A | 6/2014 |
| KR | 10-2018-0110412 A | 10/2018 |

* cited by examiner

*Primary Examiner* — Min Huang (57) ABSTRACT

A storage device includes a memory including a plurality of word lines, a plurality of bit lines and a plurality of memory cells, and a controller configured to control the memory and perform a read retry operation for the memory using a read retry table. The memory includes a special block that stores a read retry table in which a plurality of read retry values are set for each of a plurality of first conditions and each of a plurality of second conditions corresponding to each of the plurality of first conditions.

18 Claims, 9 Drawing Sheets

| Cycle | Retention | Read Disturb | RR0 | RR1 | ... |
|---|---|---|---|---|---|
| 1 | | | | | |
| 100 | | ⋮ | ⋮ | ⋮ | |
| 200 | | ⋮ | ⋮ | ⋮ | |
| ⋮ | | | | | |

FIG.5

| Cycle | Retention | WL group | RR0 | RR1 | ... |
|---|---|---|---|---|---|
| 1 | | Group 0 | | | |
| | | Group 1 | | | |
| | | Group 2 | | | |
| | | | | | |
| | | | | | |
| | | | | | |
| | | | | | |
| | | | | | |
| 100 | | ⋮ | ⋮ | ⋮ | |
| 200 | | ⋮ | ⋮ | ⋮ | |
| ⋮ | | | | | |

FIG.6

| Cycle | Retention | Read Disturb | WL group | RR0 | RR1 | ... |
|---|---|---|---|---|---|---|
| 1 | | | Group 0 | | | |
| | | | Group 1 | | | |
| | | | Group 0 | | | |
| | | | Group 1 | | | |
| | | | | | | |
| | | | | | | |
| | | | | | | |
| | | | | | | |
| | | | | | | |
| | | | | | | |
| | | | | | | |
| | | | | | | |
| 100 | | ⋮ | ⋮ | ⋮ | ⋮ | |
| 200 | | ⋮ | ⋮ | ⋮ | ⋮ | |
| ⋮ | | | | | | |

MEMORY CONTROL CIRCUIT PROVIDING DIE-LEVEL READ RETRY TABLE, MEMORY PACKAGE, AND STORAGE DEVICE

CROSS-REFERENCE TO RELATED APPLICATION

The present application claims priority under 35 U.S.C. § 119(a) to Korean Patent Application No. 10-2022-0091896 filed in the Korean Intellectual Property Office on Jul. 25, 2022, which is incorporated herein by reference in its entirety.

BACKGROUND

1. Technical Field

Various embodiments generally relate to a memory control circuit providing a die-level read retry table, a memory package, and a storage device.

2. Related Art

A storage device is a device that stores data on the basis of a request of a host such as a computer, a mobile terminal such as a smartphone or a tablet, and various electronic devices.

The storage device may include a controller for controlling a memory (e.g., a volatile memory or a nonvolatile memory). The controller may receive a command from the host, and may execute or control an operation for reading, writing or erasing data with respect to the memory included in the storage device, based on the received command.

When the controller performs an operation for reading data stored in the memory, errors may occur when the read operation is not normally performed due to a change in the characteristics of the memory.

SUMMARY

Various embodiments are directed to measures capable of improving the performance of a read operation of a storage device by performing a read retry operation based on an optimal read retry table set for each memory.

In an embodiment, a storage device may include: a memory including a plurality of word lines, a plurality of bit lines and a plurality of memory cells, and including a special block that stores a read retry table in which a plurality of read retry values are set for each of a plurality of first conditions and each of a plurality of second conditions corresponding to each of the plurality of first conditions; and a controller configured to control the memory and perform a read retry operation for the memory using the read retry table.

In an embodiment, a memory package may include: a first memory including a first special block storing a first read retry table in which a plurality of first read retry values are set for each of a plurality of first conditions and each of a plurality of second conditions corresponding to each of the plurality of first conditions; and a second memory including a second special block storing a second read retry table in which a plurality of second read retry values are set for each of the plurality of first conditions and each of the plurality of second conditions.

In an embodiment, a memory control circuit may include: a read retry generator configured to generate a read retry table in which a plurality of read retry values are set for each of a plurality of first conditions and each of a plurality of second conditions with respect to at least one memory; and a read retry outputter configured to store the read retry table in a special block of the at least one memory.

According to the embodiments of the disclosed technology, it is possible to provide measures capable of improving performance of a read operation for a memory included in a storage device.

DETAILED DESCRIPTION

Hereinafter, embodiments of the present disclosure are described in detail with reference to the accompanying drawings.

Figure 1:
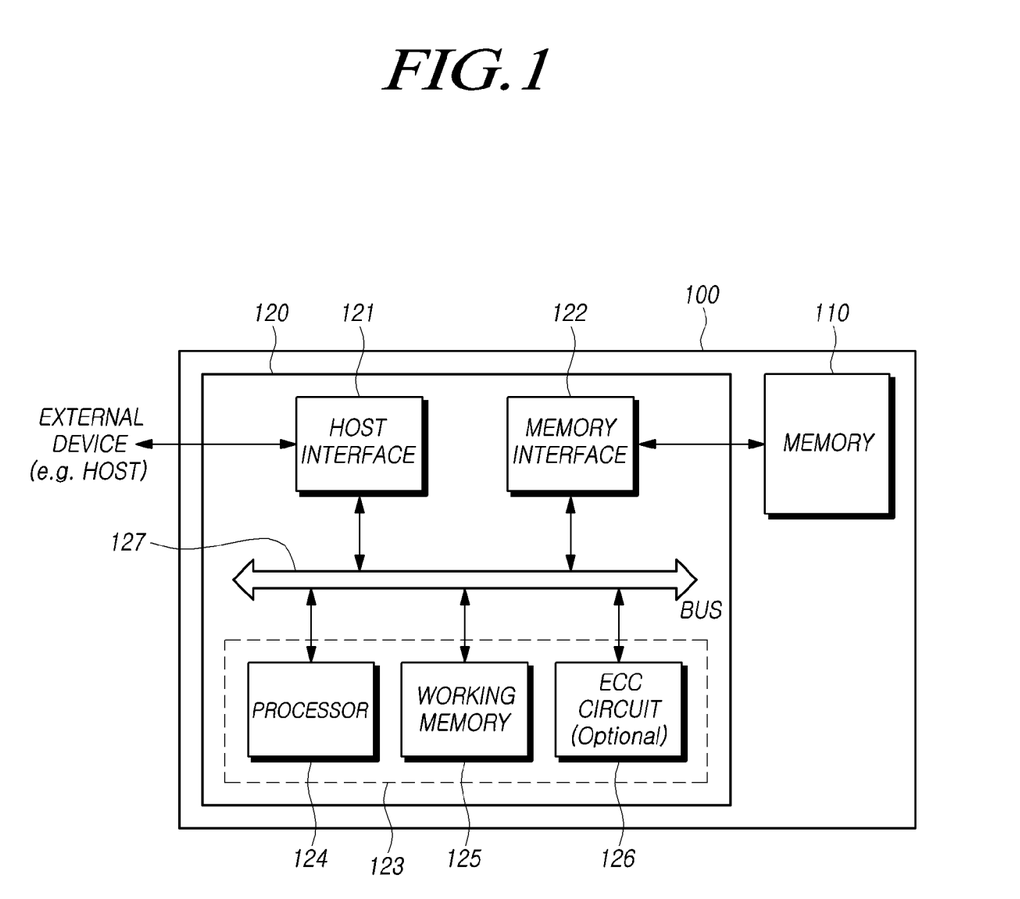
FIG. 1 is a schematic configuration diagram of a storage device according to an embodiment of the disclosure.

FIG. 1 is a schematic configuration diagram of a storage device based on an embodiment of the disclosure.

Referring to FIG. 1, a storage device 100 may include a memory 110 that stores data, and a controller 120 that controls the memory 110.

The memory 110 may include a plurality of memory blocks, and may operate in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") that store data. Such a memory cell array may exist in a memory block.

For example, the memory 110 may be implemented in various memory types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (STT-RAM).

The memory 110 may be implemented as a three-dimensional array structure. Embodiments of the disclosed technology may be applied to not only a flash memory in which a charge storage layer is configured by a conductive floating gate, but also to a charge trap flash (CTF) in which a charge storage layer is configured by a dielectric layer.

The memory 110 may receive a command and an address from the controller 120 and may access an area that is selected by the address in the memory cell array. In other words, the memory 110 may perform an operation indicated by the command, on the area selected by the address.

For example, the memory 110 may perform a program operation, a read operation and an erase operation. When performing a program operation, the memory 110 may program data to the area selected by the address. When performing a read operation, the memory 110 may read data from the area selected by the address. In an erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. Also, the controller 120 may control the operation of the memory 110 without a request from the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, a mobility device (e.g., a vehicle, a robot or a drone) capable of driving under human control or autonomous driving, etc.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be included in devices that are separated from each other. The controller 120 and the host may be implemented by being integrated into one device. For the sake of convenience in explanation, descriptions below describe an example in which the controller 120 and the host are in devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface which uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 and may provide an interface for communication with the memory 110. That is to say, the memory interface 122 may be configured to provide an interface between the memory 110 and the controller 120 in response to the control of the control circuit 123.

The control circuit 123 performs general control operations of the controller 120 to control the operation of the memory 110. To this end, for instance, the control circuit 123 may include at least one of a processor 124 and a working memory 125, and may selectively include an error detection and correction circuit (ECC circuit) 126.

The processor 124 may control the general operation of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate it into the physical block address (PBA) by using a mapping table.

The flash translation layer may use various address mapping methods depending on a mapping unit. Representative address mapping methods include a page mapping method, a block mapping method and a hybrid mapping method.

The processor 124 may randomize data received from the host. For example, the processor 124 may randomize data received from the host, by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. An operation of the storage device 100 to be described below based on an embodiment of the disclosed disclosure may be implemented in such a way that the processor 124 executes firmware in which the corresponding operation is defined.

Firmware, as a program to be executed in the storage device 100 to drive the storage device 100, may include various functional layers. For example, the firmware may include binary data, in which codes for executing the functional layers are respectively defined.

For example, the firmware may include at least one from among a flash translation layer (FTL) that performs a translating function between a logical address requested to the storage device 100 from the host and a physical address of the memory 110, a host interface layer (HIL) that serves to analyze a command requested to the storage device 100 from the host and transfer the command to the flash translation layer (FTL), and a flash interface layer (FIL) that transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of the defined logic calculation in the working memory 125. The processor 124 may control the controller 120 to generate a command or a signal, according to the result of performing the logic calculation defined in the firmware. When a part of firmware in which a defined logic calculation is not loaded in the working memory 125, the processor 124 may generate an event (e.g., an interrupt) for loading the corresponding part of the firmware into the working memory 125.

The processor 124 may load metadata necessary for driving firmware from the memory 110. The metadata, such as data for managing the memory 110, may include management information on user data stored in the memory 110.

Firmware may be updated while the storage device 100 is manufactured or while the storage device 100 is operating or while the firmware is executed. The controller 120 may download new firmware from the outside of the storage device 100 and update existing firmware with the new firmware.

The working memory 125 may store firmware, a program code, a command and data, which are necessary to drive the controller 120. An example of such a working memory 125 includes a volatile memory that may include at least one from among an SRAM (static RAM), a DRAM (dynamic RAM) and an SDRAM (synchronous DRAM).

The error detection and correction circuit 126 may detect an error bit of target data and correct the detected error bit, by using an error correction code. The target data may be, for example, data stored in the working memory 125 or data read from the memory 110.

The error detection and correction circuit 126 may be implemented to decode data by using the error correction code. The error detection and correction circuit 126 may be implemented by various code decoders. For example, a decoder that performs unsystematic code decoding or a decoder that performs systematic code decoding may be used.

For example, the error detection and correction circuit 126 may detect an error bit by the unit of a set sector in each of read data. More specifically, each read data may be constituted by a plurality of sectors. A sector may mean a data unit smaller than a page, which is the read unit of a flash memory. Sectors constituting each read data may be matched with one another through an address.

The error detection and correction circuit 126 may calculate a bit error rate (BER), and may determine whether an error is correctable or not, in sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 432 may determine that a corresponding sector is correctable or a pass.

The error detection and correction circuit 126 may perform an error detection and correction operation sequentially for all read data. When a sector included in read data is correctable, the error detection and correction circuit 126 may omit an error detection and correction operation for a corresponding sector. When the error detection and correction operation for all read data is completed, the error detection and correction circuit 126 may detect a sector which is determined to be uncorrectable last. There may be one or more sectors that are determined to be uncorrectable. The error detection and correction circuit 126 may transfer information (e.g., address information) about the uncorrectable sector to the processor 124.

A bus 127 may be configured to provide channels among the components 121, 122, 124, 125 and 126 of the controller 120. The bus 127 may include, for example, a control bus for transferring various control signals, commands and the likes, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In some embodiments, in addition to the above-described components 121, 122, 124, 125 and 126 of the controller 120, one or more other components may be added.

Hereinbelow, the memory 110 will be described in further detail with reference to FIG. 2.

Figure 2:
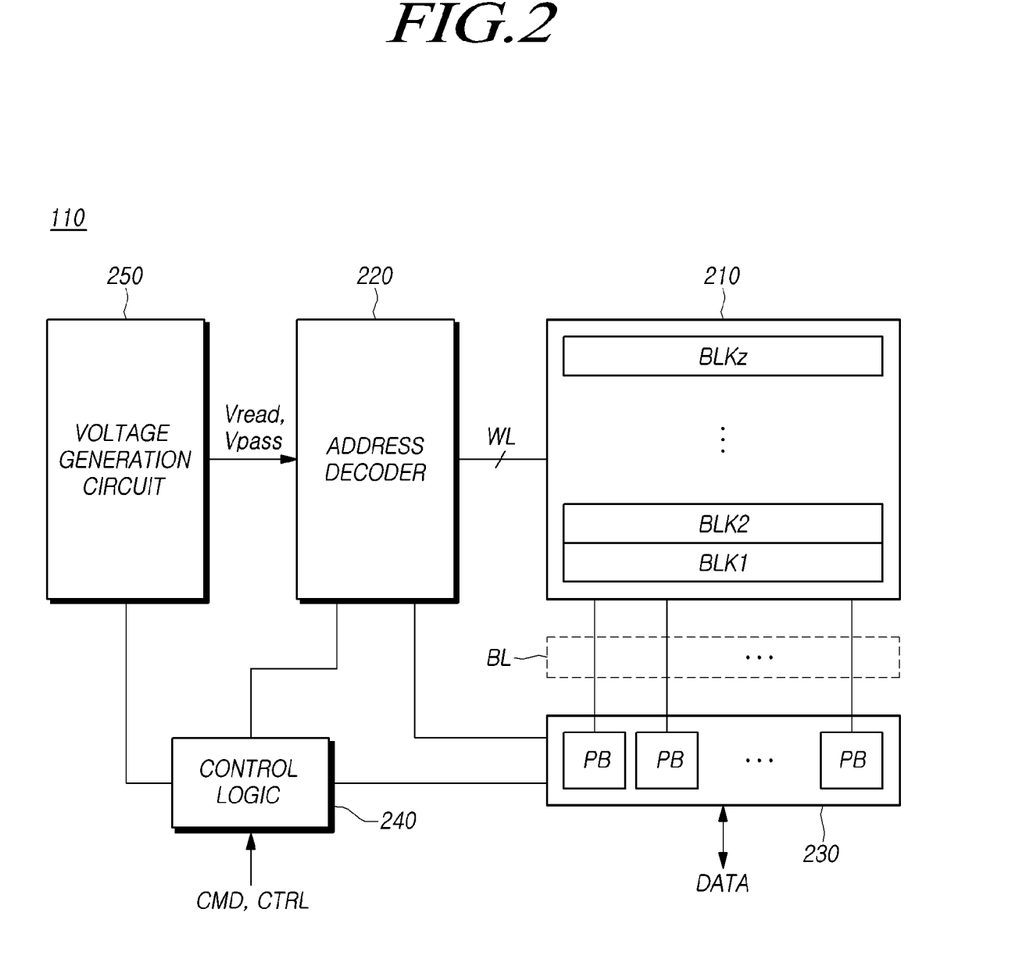
FIG. 2 is a block diagram schematically illustrating a memory of FIG. 1.

FIG. 2 is a block diagram schematically illustrating a memory of FIG. 1.

Referring to FIG. 2, a memory 110 based on an embodiment of the disclosed technology may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells (MC). For example, the plurality of memory cells (MC) may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells (MC) included in the memory cell array 210 may store data of at least 1 bit. For instance, each of the plurality of memory cells (MC) included in the memory cell array 210 may be a signal-level cell (SLC), which stores 1-bit data. For another instance, each of the plurality of memory cells (MC) included in the memory cell array 210 may be a multi-level cell (MLC), which stores 2-bit data. For still another instance, each of the plurality of memory cells (MC) included in the memory cell array 210 may be a triple-level cell (TLC), which stores 3-bit data. For yet another instance, each of the plurality of memory cells (MC) included in the memory cell array 210 may be a quad-level cell (QLC), which stores 4-bit data. In a further instance, the memory cell array 210 may include a plurality of memory cells (MC), each of which stores 5 or more-bit data.

The number of bits of data stored in each of the plurality of memory cells (MC) may be dynamically determined. For example, a single-level cell that stores 1-bit data may change to a triple-level cell which stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block according to the decoded block address.

The address decoder 220 may receive a read voltage Vread and a pass voltage Vpass from the voltage generation circuit 250.

In applying a read voltage during a read operation, the address decoder 220 may apply the read voltage Vread to a selected word line WL in a selected memory block, and may apply the pass voltage Vpass to the remaining unselected word lines WL.

In a program verify operation, the address decoder 220 may apply a verify voltage generated in the voltage generation circuit 250 to a selected word line WL in a selected memory block, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed in a unit of a page. An address received when a read operation or a program operation is requested may include at least one from among a block address, a row address and a column address.

The address decoder 220 may select one memory block and one word line WL depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes the plurality of page buffers PB. The read and write circuit 230 may include data buffers that take charge of a data processing function, and may further include cache buffers which take charge of a caching function.

The plurality of page buffers PB may be coupled to the memory cell array 210 through the plurality of bit lines BL. In a read operation and a program verify operation, the plurality of page buffers PB may continuously supply sensing current to bit lines BL coupled with memory cells to sense threshold voltages (Vth) of the memory cells, and may latch sensing data by sensing, through sensing nodes, changes in amounts of current flowing according to the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. In an embodiment, the read and write circuit 230 may include a column select circuit and in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell that is coupled to one of the plurality of word lines WL and one of the plurality of bit lines BL may be defined. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate that is surrounded by a dielectric and a control gate to which a gate voltage is applied from a word line WL.

In each memory block, a first select line (also referred to as a source select line or a drain select line) may be additionally disposed beyond a first outermost word line WL to be more adjacent to the read and write circuit 230, and a second select line (also referred to as a drain select line or a source select line) may be additionally disposed beyond a second outermost word line WL.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by a unit of a page, and an erase operation may be performed by a unit of a memory block.

In a read operation for the memory 110, the read operation by a preset read voltage Vread may not be normally performed due to a change in the characteristics of a memory cell. In this case, a read operation may be performed by changing the read voltage Vread. Embodiments of the disclosure provide a read retry value for performing such a read retry operation, where the read retry value is set to an optimal value for the memory 110. As a result, disclosed embodiments offer measures for improving performance of a read operation for the memory 110.

Figure 3:
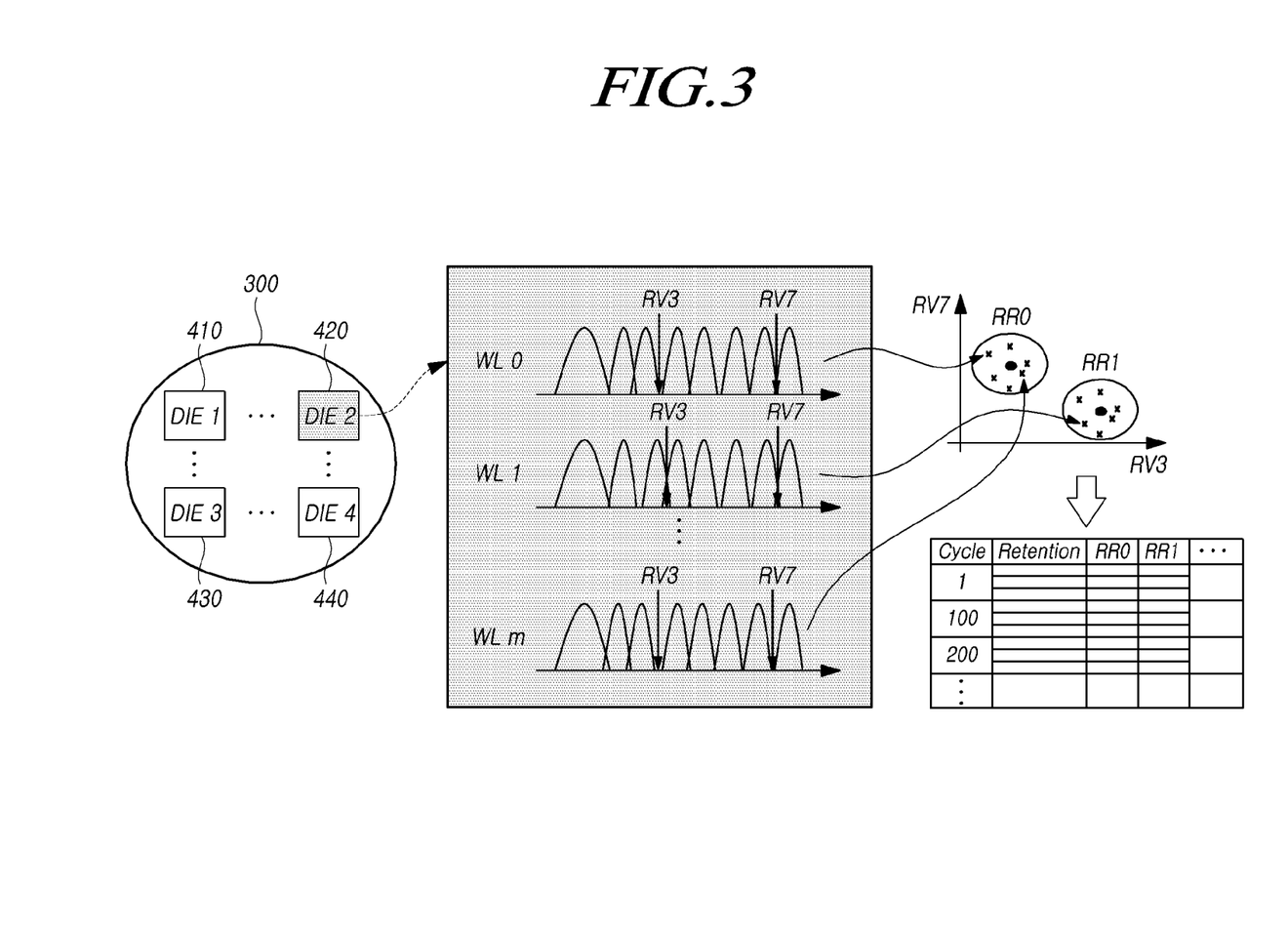
FIG. 3 is a diagram illustrating an example of a scheme of generating a die-level read retry table in a storage device according to an embodiment of the disclosure.
Figure 4:
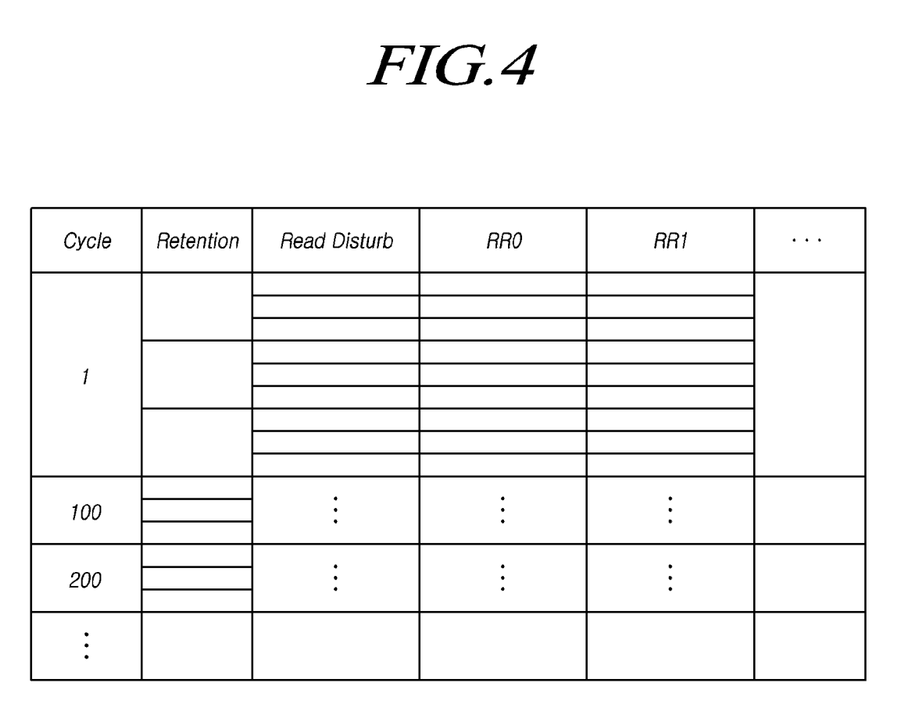
FIGS. 4 to 6 are diagrams illustrating examples of a die-level read retry table in a storage device according to an embodiment of the disclosure.
Figure 5:
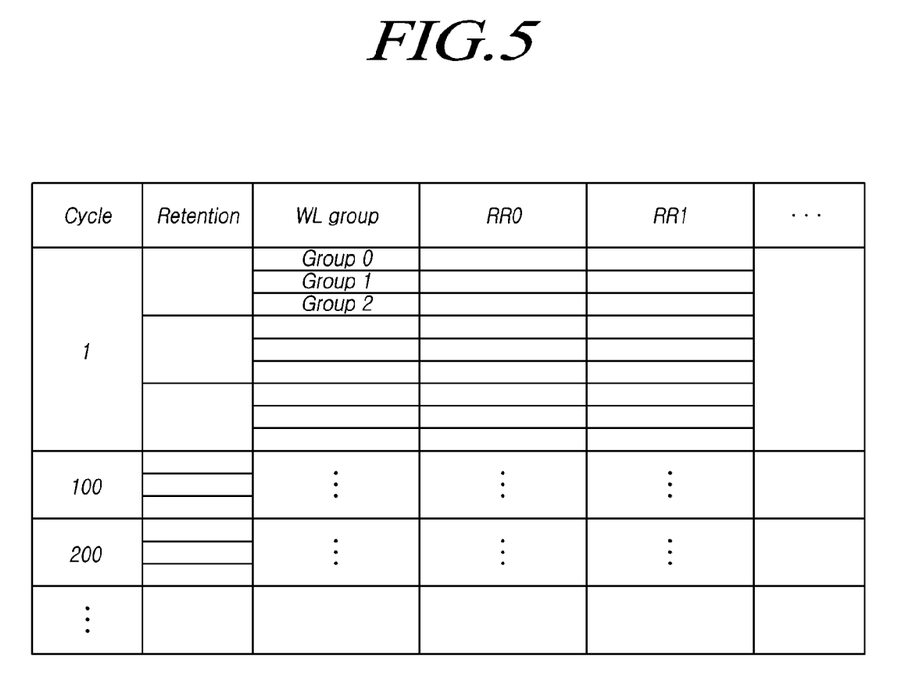
Figure 6:
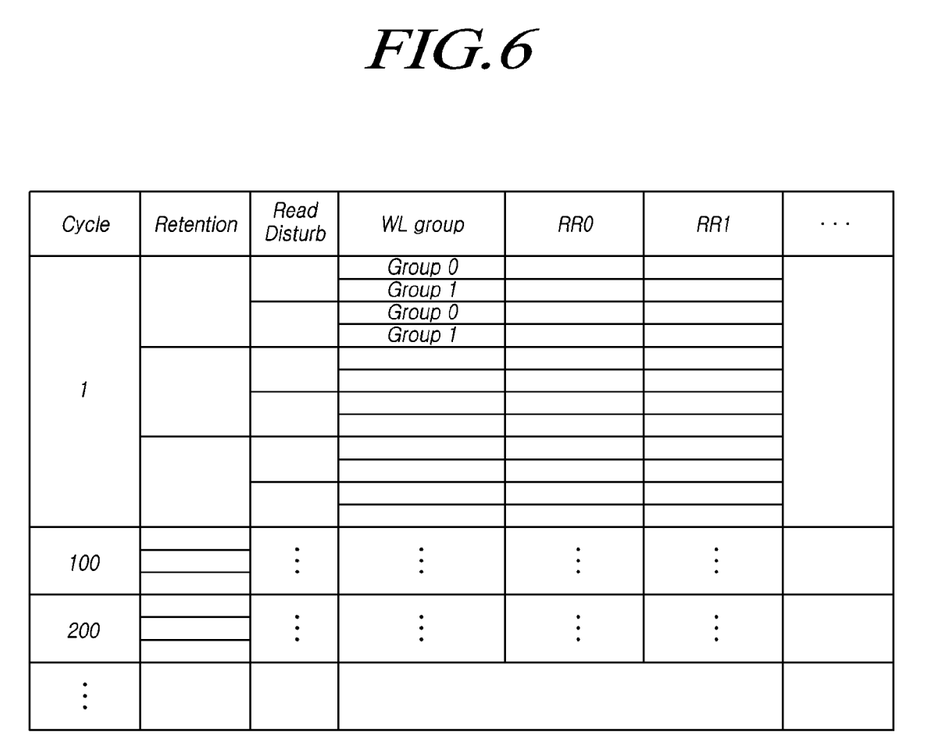

FIG. 3 is a diagram illustrating an example of a scheme of generating a die-level read retry table in a storage device based on an embodiment of the disclosure. FIGS. 4 to 6 are diagrams illustrating examples of a die-level read retry table in a storage device based on an embodiment of the disclosure.

Referring to FIG. 3, a plurality of memory dies 410, 420, 430 and 440 may be obtained from the same wafer 300. Each of the plurality of memory dies 410, 420, 430 and 440 may mean a memory chip, or may mean a memory 110 included in a storage device 100 described above.

The plurality of memory dies 410, 420, 430 and 440 obtained from the same wafer 300 may have different characteristics. When a read retry operation is performed by applying common read retry values to the plurality of memory dies 410, 420, 430 and 440, the performance of the read retry operation may degrade due to deviations in the characteristics of the plurality of memory dies 410, 420, 430 and 440.

Embodiments of the disclosure may perform a read retry operation using a read retry table set for each of the plurality of memory dies 410, 420, 430 and 440, thereby providing measures for improving the performance of the read retry operation.

A read retry table in which optimal read retry values for each of the plurality of memory dies 410, 420, 430 and 440 are set may be generated.

In an example, read retry values may be derived for a plurality of word lines WL included in a second memory die 420. Optimal read retry values may be derived for each of a plurality of word lines WL0, WL1, ..., WLm by using a third read voltage RV3 and a seventh read voltage RV7. The third read voltage RV3 and the seventh read voltage RV7 may be selected as reference read voltages. By using the third read voltage RV3 and the seventh read voltage RV7, a distribution of read retry value of each word line and an optimal read retry value of each word line may be obtained.

Derivation of optimal read retry values for a sample from among the plurality of word lines WL may be obtained through calculation, and optimal read retry values capable of covering all the word lines WL may be derived through a machine learning algorithm (e.g., K-means clustering or neural network-based clustering).

As in an example shown in FIG. 3, when clustering is performed, the center of each cluster may be derived as a read retry value. The number of clusters may be derived as the number of read retry values. For example, an optimal read retry value of WL0 and WLm may be included in a cluster of RR0. And an optimal read retry value of WL1 may be included in a cluster of RR1. The RR0 and the RR1 may be representative value of each cluster, and may be a read retry value used for making the read retry table.

Read retry values may be set for a plurality of conditions.

For example, read retry values may be set for each of a plurality of first conditions. Also, read retry values may be set for each of a plurality of second conditions. The plurality of first conditions and the plurality of second conditions may correspond one-to-one. Alternatively, each of the plurality of first conditions may correspond to at least two second conditions.

Read retry values may be set for each of the plurality of first conditions and each of the plurality of second conditions set for each of the plurality of first conditions.

For example, the plurality of first conditions may be the numbers of cycles. For example, the plurality of second conditions may be retention periods.

At least two retention periods may correspond to each of a plurality of numbers of cycles.

A read retry table in which optimal read retry values are set for a number of cycles and a retention period may be generated.

Such a read retry table may be stored in a special block, which is included in each of the plurality of memory dies 410, 420, 430 and 440.

A read retry table in which optimal read retry values are set for at least two conditions may be stored in a special block of the memory 110 of the storage device 100. The controller 120 of the storage device 100 may perform a read retry operation for the corresponding memory 110 by using the read retry table stored in the special block of the memory 110.

Since a read retry operation is performed for each memory 110 by using a read retry table in which optimal read retry values are set, it is possible to prevent the performance of the read retry operation from degrading due to deviations in the characteristics of dies.

Read retry values of a read retry table may be set for each of at least two conditions, or may be set for each of at least three conditions.

For example, referring to FIG. 4, a read retry table may include read retry values that are set for each of a plurality of first conditions, each of a plurality of second conditions corresponding to each of the plurality of first conditions and each of a plurality of third conditions corresponding to each of the plurality of second conditions.

For example, the first conditions may be the numbers of cycles. For example, the second conditions may be retention periods. For example, the third conditions may be the numbers of read disturbances.

Read retry values may be set for the numbers of cycles, the retention periods and the numbers of read disturbances.

Also, at least one additional condition (e.g., an amount of change in threshold voltage according to a temperature) may be further added to provide a read retry table in which read retry values are set for a plurality of conditions exceeding three.

Since optimal read retry values derived for each die are set and provided for each condition, a read retry operation based on a read retry table stored in each memory 110 may be performed to improve the performance of the read retry operation.

Further, a read retry table may be generated by deriving optimal read retry values for a group having a similar characteristic distribution existing in the memory 110.

For example, referring to FIG. 5, at least two retention periods may correspond to a single number of cycles. At least two word line groups may correspond to each retention period.

A word line group may include at least two word lines WL having similar characteristic distributions from among the plurality of word lines WL.

A read retry table may be generated as optimal read retry values are derived and set for each number of cycles, each retention period and each word line group.

By applying read retry values set for each word line group having a similar characteristic distribution, degradation in the performance of a read retry operation due to a deviation in characteristics between word lines WL may be decreased in the memory 110.

In a word line group, for example, read retry values that are set in the memory 110 may be set in various ways. Read retry values may be set for each memory block group including at least two memory blocks included in the memory 110. Alternatively, read retry values may be set for each page group including at least two pages.

In the process of deriving optimal read retry values for each die, read retry values may be derived for each group having similar characteristics in the memory 110, such as a word line group or a memory block group. A read retry operation may be performed according to read retry values in which deviations in characteristics in the memory 110 as well as deviations in characteristics between dies are reflected.

Even when read retry values are set for each word line group or memory block group, a read retry table in which read retry values are set for each of at least three conditions may be provided.

For example, referring to FIG. 6, read retry values may be set for a number of cycles, a retention period and a number of read disturbances. At least two word line groups may be set in correspondence to each number of cycles, each retention period and each number of read disturbances.

Read retry values may be set for a number of cycles, a retention period, a number of read disturbances and a word line group. A read retry operation based on read retry values that are optimized for a die and in which deviations in characteristics between word line groups in the memory 110 are reflected may be performed.

Moreover, read retry values for a combination of conditions not included in a read retry table may be derived and applied in a read retry operation.

For example, read retry values for a number of cycles between the numbers 100 and 200 of cycles may be calculated on the basis of read retry values set for the numbers 100 and 200 of cycles, and may be applied in a read retry operation. Alternatively, read retry values for a retention period not set for the number of cycles may be derived and applied on the basis of read retry values set for a combination of a number of cycles and a retention period.

Since a read retry operation based on a read retry table in which optimal read retry values are set for each memory 110 is performed, it is possible to prevent the performance of the read retry operation from degrading due to deviations in the characteristics of dies.

In addition, read retry values for a combination of unset conditions may be calculated through learning for changes in set read retry values, and may be applied in a read retry operation.

Such a read retry table may be stored in a special block of the memory 110. A read retry operation using the read retry table stored in the special block may be performed.

Figure 7:
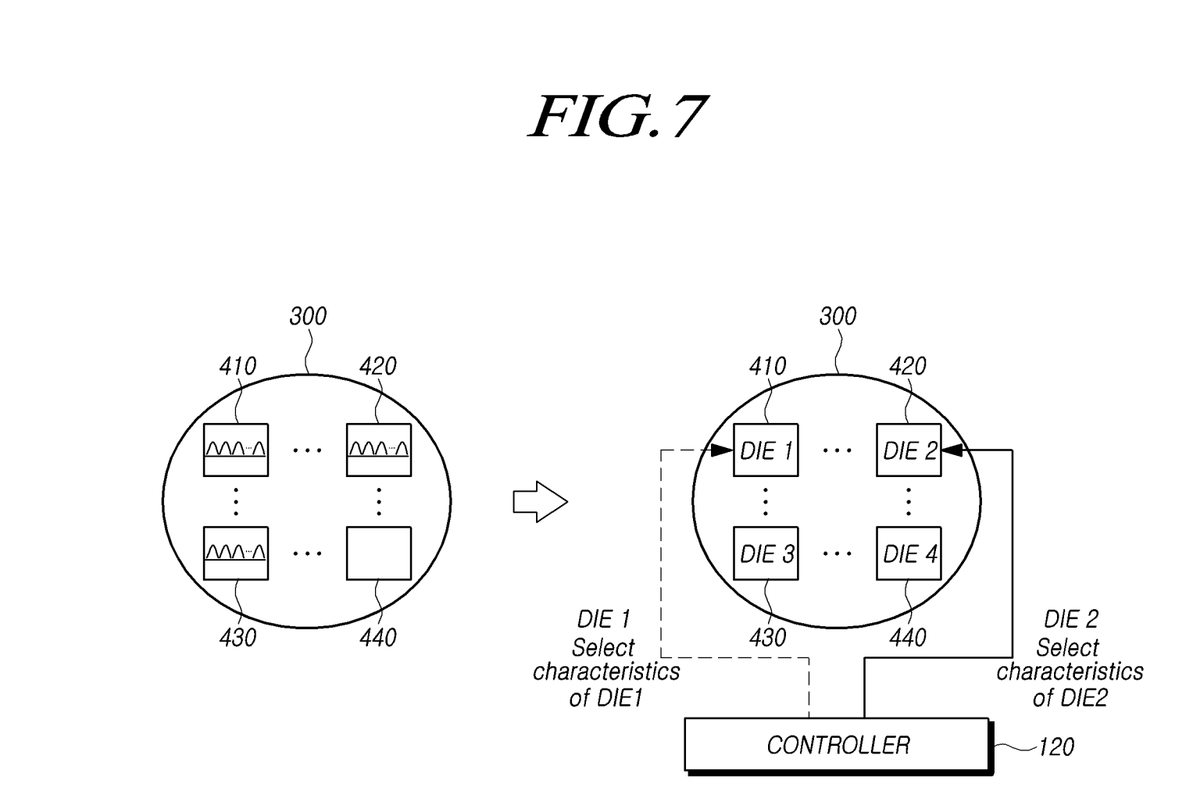
FIG. 7 is a diagram illustrating an example of a scheme of performing a read retry operation on the basis of a die-level read retry table in a storage device according to an embodiment of the disclosure.

FIG. 7 is a diagram illustrating an example of a scheme of performing a read retry operation on the basis of a die-level read retry table in a storage device based on an embodiment of the disclosure.

Referring to FIG. 7, a plurality of memory dies 410, 420, 430 and 440 may be obtained from a wafer 300. The plurality of memory dies 410, 420, 430 and 440 may have characteristics that deviate among the memory dies. A read retry table in which optimal read retry values derived for each of the plurality of memory dies 410, 420, 430 and 440 are set may be generated. The read retry table may be stored in a special block of each of the plurality of memory dies 410, 420, 430 and 440.

When performing a read retry operation, the controller 120 may perform the read retry operation on the basis of read retry values set in the read retry table stored in the special block of each of the memory dies 410, 420, 430 and 440.

For example, when performing a read retry operation for a first memory die 410, the controller 120 may perform the read retry operation on the basis of a read retry table having read retry values set by reflecting the characteristics of the first memory die 410.

When performing a read retry operation for a second memory die 420, the controller 120 may perform the read retry operation on the basis of a read retry table having read retry values set by reflecting the characteristics of the second memory die 420.

The controller 120 included in the storage device 100 may perform a read retry operation on the basis of a read retry table which is stored in a special block of the memory 110 and has read retry values set by reflecting the characteristics of the corresponding memory 110.

When the storage device 100 is a memory package including at least two memories 110, a read retry operation based on a read retry table for each of the at least two memories 110 may be performed.

For example, a memory package may include a first memory and a second memory. The first memory may include a first read retry table in which the characteristics of the first memory are reflected and in which optimal read retry values are set for each condition. The second memory may include a second read retry table in which the characteristics of the second memory are reflected and in which optimal read retry values are set for each condition.

The first read retry table and the second read retry table may be independently set. At least a part of read retry values in the first read retry table may be different from read retry values in the second read retry table.

Since a read retry table having read retry values optimized for each memory 110 is stored in the memory 110, the controller 120 that controls the memory package may perform a read retry operation for each memory 110 on the basis of the independent read retry table stored in each memory 110.

Due to this fact, it is possible to prevent the performance of a read retry operation from degrading due to deviations in the characteristics of memories 110, and thus, the performance of the read retry operation may be improved.

A circuit that generates a read retry table in which optimal read retry values are set may be implemented in the form of a circuit that drives the storage device 100.

Figure 8:
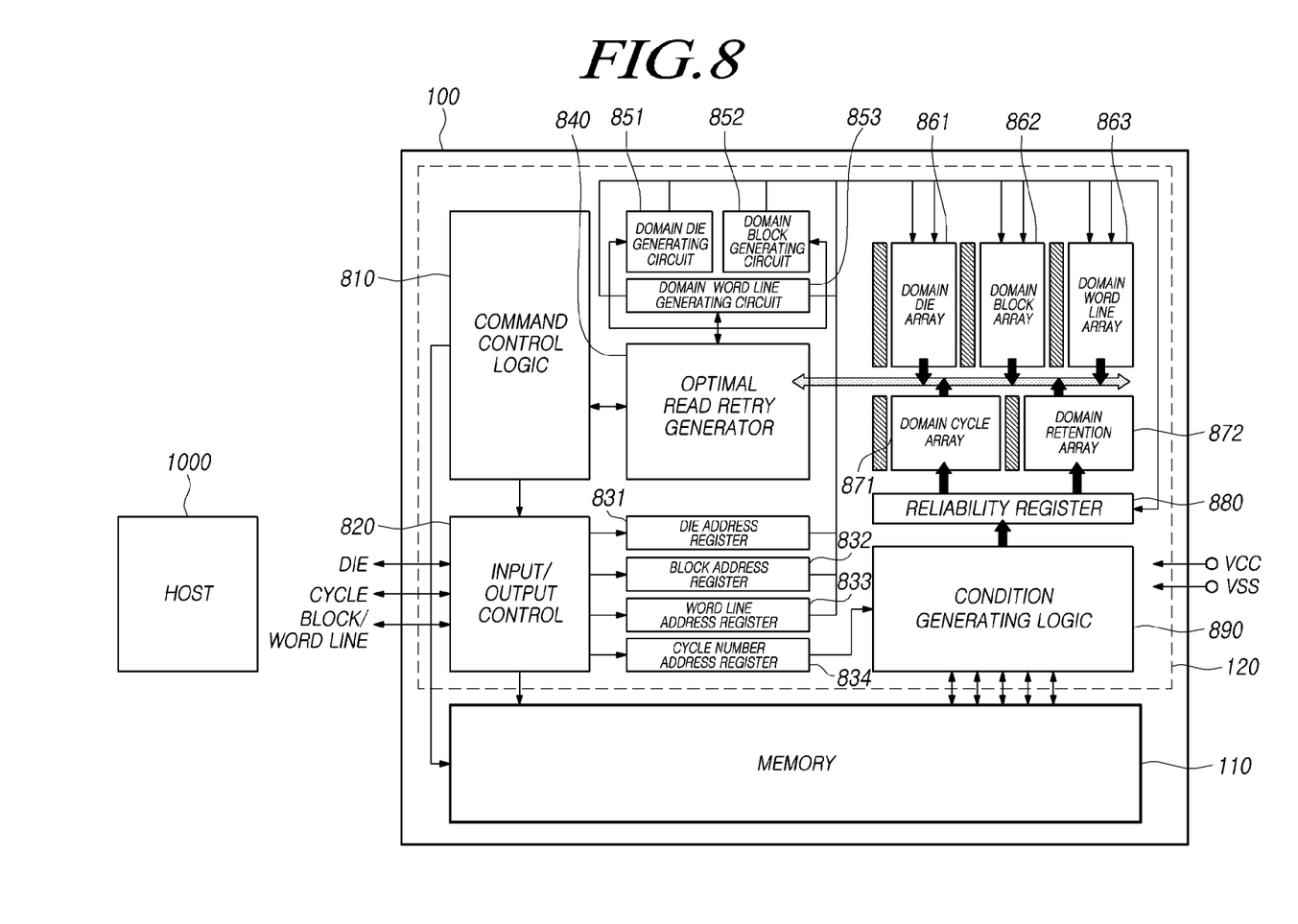
FIG. 8 is a diagram illustrating an example in which a function of generating a die-level read retry table is implemented in a circuit for controlling a memory in a storage device, according to an embodiment of the disclosure.

FIG. 8 is a diagram illustrating an example in which a function of generating a die-level read retry table is implemented in a circuit for controlling a memory in a storage device, according to an embodiment of the disclosure.

Referring to FIG. 8, a circuit that generates a die-level read retry table may be implemented in the form of a memory control circuit. Also, the memory control circuit may be implemented as a configuration of a controller 120 of a storage device 100.

While FIG. 8 illustrates an example in which the memory control circuit is configured as a part of the controller 120 of the storage device 100, a circuit that generates a read retry table having optimal read retry values may be implemented in the form of a separate control circuit such as an SoC. As described above, a die-level read retry table may be generated by a separate device and be stored in a special block of the memory 110. In addition, as will be described later, the memory control circuit may be implemented in the form of an SoC including a circuit that generates a die-level read retry table.

Describing a configuration or a function related to the memory control circuit in the controller 120 included in the storage device 100, an input/output control 820 may receive data on a die, a number of cycles, a memory block and a word line WL from the outside. The data received through the input/output control 820 may be stored in a die address register 831, a block address register 832, a word line address register 833 and a cycle number address register 834.

The data stored in the cycle number address register 834 may be transferred to a condition generating logic 890. The condition generating logic 890 may generate and output a condition such as a number of cycles, a retention period or a number of read disturbances as non-limiting examples. As the conditions outputted by the condition generating logic 890 pass through a reliability register 880, a domain cycle array 871 and a domain retention array 872 may be selected.

According to the data stored in the die address register 831, a domain die generating circuit 851 may select a domain die array 861. According to the data stored in the block address register 832, a domain block generating circuit 852 may select a domain block array 862. According to the data stored in the word line address register 833, a domain word line generating circuit 853 may select a domain word line array 863.

An optimal read retry generator 840 may generate a read retry table in which optimal read retry values are set for each condition depending on the selected domain die array 861, domain block array 862, domain word line array 863, domain cycle array 871 and domain retention array 872. The optimal read retry generator 840 may mean a read retry generator.

A command control logic 810 may store the read retry table, generated by the optimal read retry generator 840, in a special block of the memory 110. For example, the command control logic 810 may mean a read retry outputter configured to store the read retry table generated by the optimal read retry generator 840 in the special block of the memory 110.

A read retry table in which optimal read retry values are set for each die, each block or each word line with respect to each condition provided by the condition generating logic 890 may be stored in the corresponding memory 110, and thereafter, may be used in a read retry operation for the corresponding memory 110.

The read retry table previously stored in the memory 110 may be updated by the memory control circuit, which is implemented as a partial configuration of the controller 120.

Figure 9:
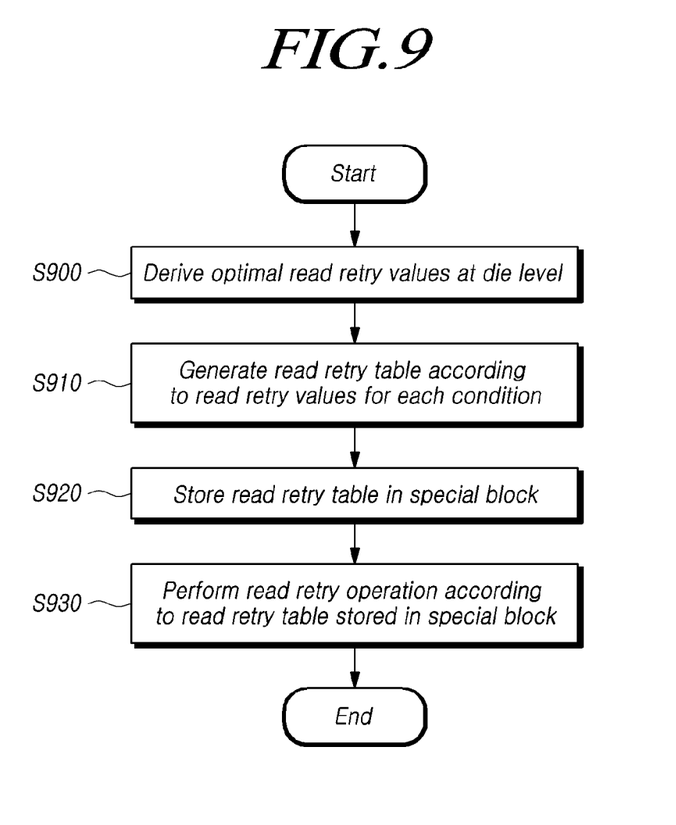
FIG. 9 is a flowchart illustrating an example of a method for operating a memory control circuit according to an embodiment of the disclosure.

FIG. 9 is a flowchart illustrating an example of a method for operating a memory control circuit according to an embodiment of the Referring to FIG. 9, a memory control circuit may derive optimal read retry values at a die level (S900). The memory control circuit may derive read retry values optimized for each condition with respect to a die, by obtaining samples of the read voltage Vread for each condition and clustering the samples through machine learning.

The memory control circuit may generate a read retry table according to the read retry values for each condition (S910). The memory control circuit may store the generated read retry table in a special block of the memory 110 (S920).

The memory control circuit may perform a read retry operation for the corresponding memory 110 on the basis of the read retry table stored in the special block of the memory 110 (S930).

According to embodiments of the disclosure, read retry operations are performed using read retry tables having optimal read retry values set for each condition at a die level. As a result, it is possible to prevent the performance of the read retry operation from degrading due to deviations in the characteristics of dies, and thus, the performance of the read retry operation for each memory 110 may be improved.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A storage device comprising:
a memory including a plurality of word lines, a plurality of bit lines and a plurality of memory cells, and including a special block that stores a read retry table in which a plurality of read retry values are set for each of a plurality of first conditions and each of a plurality of second conditions corresponding to each of the plurality of first conditions; and
a controller configured to control the memory and perform a read retry operation for the memory using the read retry table,
wherein the read retry table is optimized for each condition with respect to the memory by obtaining samples of read voltages for each of the plurality of first conditions and each of the plurality of second conditions and clustering the samples through machine learning.

2. The storage device according to claim 1, wherein the plurality of read retry values are set for each of a plurality of third conditions corresponding to each of the plurality of second conditions.

3. The storage device according to claim 2, wherein the first condition is numbers of cycles, the second condition is retention periods, and the third condition is numbers of read disturbances.

4. The storage device according to claim 1, wherein the plurality of read retry values are set for a word line group including at least two word lines from among the plurality of word lines.

5. The storage device according to claim 4, wherein at least two word line groups correspond to each of the plurality of first conditions and each of the plurality of second conditions.

6. The storage device according to claim 1, wherein the plurality of read retry values are set for a memory block group including at least two memory cells from among the plurality of memory cells.

7. The storage device according to claim 1, wherein the controller calculates read retry values for a first condition, and for a second condition not set in the read retry table, using the plurality of first conditions and the plurality of second conditions previously set in the read retry table.

8. The storage device according to claim 1, wherein the controller generates optimal read retry values in each of the plurality of first conditions and each of the plurality of second conditions for the memory.

9. The storage device according to claim 1, wherein the controller updates the read retry table stored in the special block.

10. A memory package comprising:
a first memory including a first special block storing a first read retry table in which a plurality of first read retry values are set for each of a plurality of first conditions and each of a plurality of second conditions corresponding to each of the plurality of first conditions, wherein the first read retry table is optimized for each condition with respect to the first memory by obtaining samples of read voltages for each of the plurality of first conditions and each of the plurality of second conditions and clustering the samples through machine learning; and
a second memory including a second special block storing a second read retry table in which a plurality of second read retry values are set for each of the plurality of first conditions and each of the plurality of second conditions, wherein the second read retry table is optimized for each condition with respect to the second memory by obtaining samples of read voltages for each of the plurality of first conditions and each of the plurality of second conditions and clustering the samples through machine learning.

11. The memory package according to claim 10, wherein the plurality of second read retry values are set independently of the plurality of first read retry values.

12. The memory package according to claim 10, wherein at least some of the plurality of second read retry values are different from at least some of the plurality of first read retry values.

13. The memory package according to claim 10, further comprising:
a controller configured to control the first memory and the second memory, perform a read retry operation for the first memory using the first read retry table, and perform a read retry operation for the second memory using the second read retry table.

14. The memory package according to claim 13, wherein the controller updates at least one of the first read retry table or the second read retry table.

15. The memory package according to claim 10, wherein the plurality of first read retry values are optimal values which are set for the first memory, and the plurality of second read retry values are optimal values which are set for the second memory.

16. A memory control circuit comprising:
a read retry generator configured to generate a read retry table in which a plurality of read retry values are set for each of a plurality of first conditions and each of a plurality of second conditions with respect to at least one memory, wherein the read retry table is optimized for each condition with respect to the at least one memory by obtaining samples of read voltages for each of the plurality of first conditions and each of the plurality of second conditions and clustering the samples through machine learning; and
a read retry outputter configured to store the read retry table in a special block of the at least one memory.

17. The memory control circuit according to claim 16, wherein the plurality of first conditions are the numbers of cycles, the plurality of second conditions are retention periods, and at least two second conditions correspond to each of the plurality of first conditions.

18. The memory control circuit according to claim 16, wherein
the at least one memory includes a first memory and a second memory,
the read retry generator generates a first read retry table for the first memory and generates a second read retry table for the second memory, and
the first read retry table is different from the second read retry table.

* * * * *